(12) United States Patent
Quek et al.

(10) Patent No.: US 6,416,909 B1
(45) Date of Patent: Jul. 9, 2002

(54) ALTERNATING PHASE SHIFT MASK AND METHOD FOR FABRICATING THE ALIGNMENT MONITOR

(75) Inventors: Shyue Fong Quek, Petaling Jaya (MY); Ting Cheong Ang, Singapore (SG); Swee Hong Choo, Singapore (SG); Sang Yee Loong, Singapore (SG)

(73) Assignee: Chartered Semiconductor Manufacturing Ltd., Singapore ( * ) Notice: Subject to any disclaimer, the term of this patent is extended or adjusted under 35 U.S.C. 154(b) by 73 days.

(21) Appl. No.: 09/618,673

(22) Filed: Jul. 18, 2000

(51) Int. Cl.[7] .................................................. G03F 9/00
(52) U.S. Cl. ............................................. 430/5; 430/22
(58) Field of Search ...................... 430/5, 22; 356/399, 356/401

(56) References Cited

U.S. PATENT DOCUMENTS

| | | | |
|---|---|---|---|
| 5,538,819 A | 7/1996 | DeMarco et al. | 430/5 |
| 5,604,059 A | 2/1997 | Imura et al. | 430/5 |
| 5,756,235 A | 5/1998 | Kim | 430/5 |
| 5,780,188 A | 7/1998 | Rolson | 430/30 |
| 5,786,116 A | 7/1998 | Rolfson | 430/5 |
| 5,897,979 A | 4/1999 | Tzu et al. | 430/5 |
| 6,042,972 A | * 3/2000 | Schulze | 430/5 |

* cited by examiner

*Primary Examiner*—S. Rosasco
(74) *Attorney, Agent, or Firm*—George O. Saile; Rosemary L. S. Pike (57) ABSTRACT

A new process for fabricating an alternating phase-shifting photomask having an alignment monitor is described. An opaque layer is provided overlying a substrate. The opaque layer is patterned to provide a mask pattern. A phase-shifting pattern is formed on the substrate wherein a portion of the phase-shifting pattern comprises an alignment monitor whereby alignment between the mask pattern and the phase-shifting pattern can be tested.

25 Claims, 7 Drawing Sheets

FIG. 8 ic patent# ALTERNATING PHASE SHIFT MASK AND METHOD FOR FABRICATING THE ALIGNMENT MONITOR

BACKGROUND OF THE INVENTION (1) Field of the Invention

The invention relates to a process for fabricating a photomask, and more particularly, to a process for fabricating an alternating phase-shifting mask and alignment monitor.

(2) Description of the Prior Art

As photolithography advances to 0.35 microns and below, new technologies are required to increase resolution of the imaging lens. One new technology is the use of alternating phase-shifting photomasks. Phase shift masks take advantage of the interference effect in a coherent or partially coherent imaging system to reduce the spatial frequency of a given object, to enhance its edge contrast, or both. It is possible to control locally the type of interference, destructive or constructive, at critical locations in a design by adding an additional patterned layer of transmitting material on the mask. This technique results in a combination of higher resolution, larger exposure latitude, and larger depth-of-focus. In phase shift lithography, a transparent coating is placed over a transparent area. The light waves passing through the coated region are delayed 180° C. out of phase with the light waves passing through the uncoated region. At the edge of a phase-shifted area, the light waves from the phase-shifted and clear areas will cancel out producing a more sharply defined interface.

The primary mask pattern consists of a patterned opaque material, such as chromium, overlying a transparent substrate, such as quartz. The phase-shifting pattern is formed by etching grooves into the transparent material at the edges of the opaque pattern or by overlaying a patterned transparent material over the opaque pattern. It is essential that the opaque pattern and the phase-shifting pattern be aligned to each other. Thus, an alignment monitor is also fabricated as part of the phase-shifting mask in order to determine if the mask has been fabricated with proper alignment.

Figure 1A:
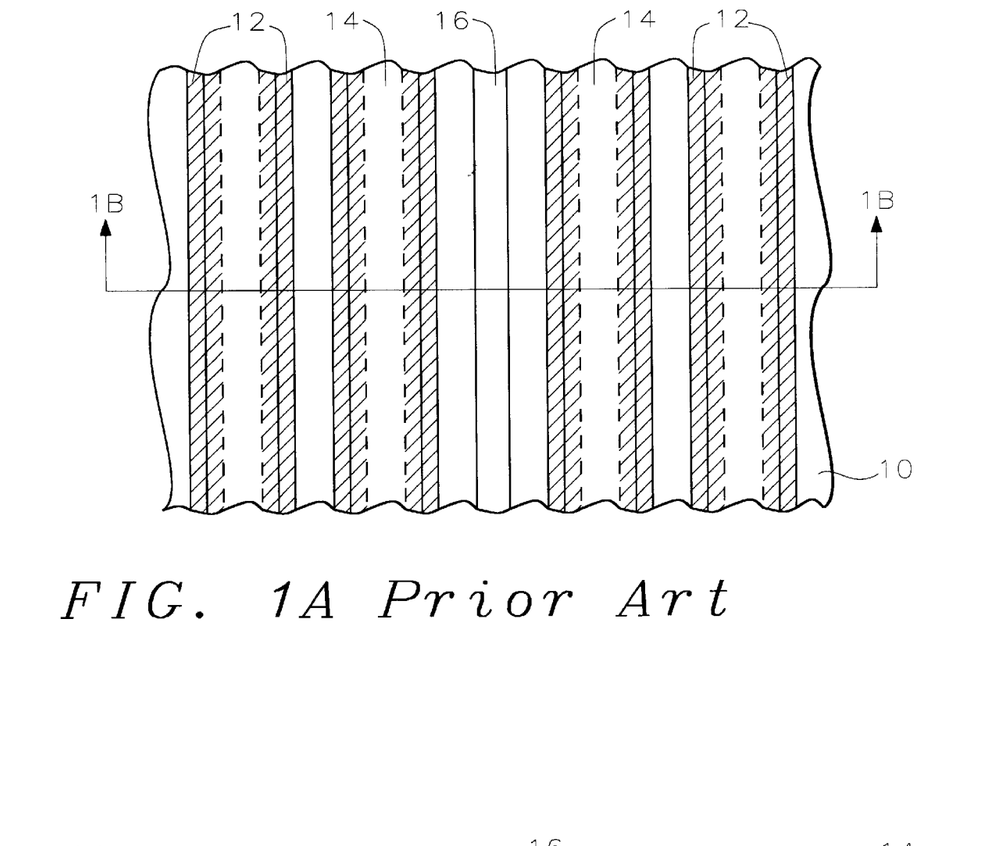
FIG. 1A schematically illustrates in top view an alternating phase-shifting mask with alignment monitor of the prior art.
Figure 1B:
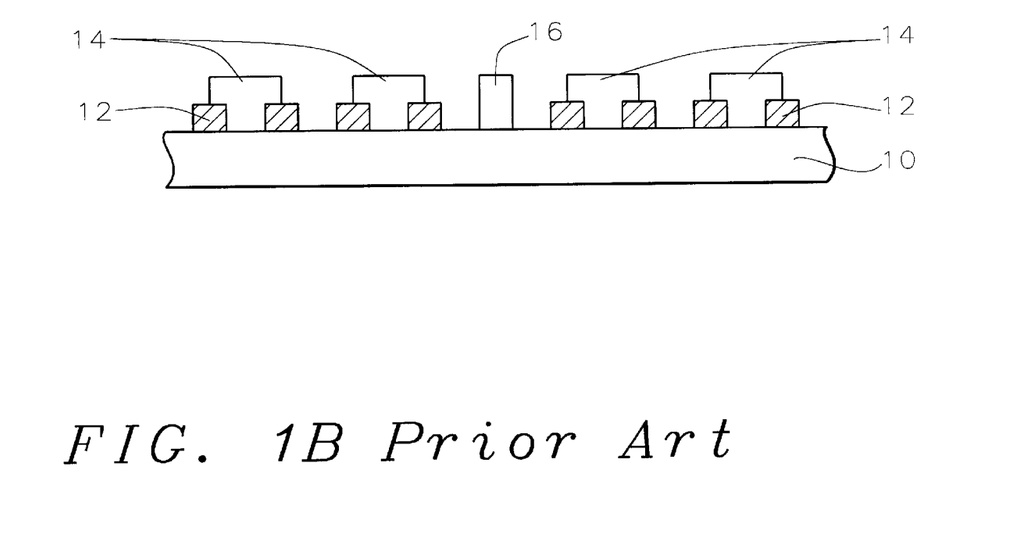
FIG. 1B schematically illustrates in cross-sectional representation view 1—1 of the alternating phase-shifting mask with alignment monitor of the prior art shown in FIG. 1A.

U.S. Pat. No. 5,756,235 to Kim discloses a phase-shifting mask having an alignment monitor. The alignment monitor is formed in a space between dense patterns of the mask. FIG. 1A illustrates in top view Kim's APSM and alignment monitor. FIG. 1B illustrates cross-sectional view 1—1 across FIG. 1A. The chrome pattern 12 has been formed on the transparent substrate 10. The patterned phase-shifting material 14 overlies the chrome pattern. The phase-shifting pattern 16 in the space between the chrome pattern is Kim's alignment monitor. Kim's alignment monitor cannot be implemented on the most common type of PSM which is formed by etching grooves into the transparent material at the edges of the opaque pattern. Also, using Kim's alignment monitor it is difficult to tell in which direction the misalignment occurs.

Other patents disclose various alternating phase-shifting masks and methods of aligning the masks in steppers. U.S. Pat. No. 5,897,979 to Tzu et al describes a APSM having alignment marks to align a stepper. U.S. Pat. No. 5,604,059 to Imura et al shows an APSM. U.S. Pat. No. 5,780,188 to Rolson teaches a method of step and repeat exposure of a mask pattern. U.S. Pat. No. 5,786,116 to Rolfson discloses fabrication of an ATOM mask using alignment marks to align the primary mask pattern and the grating pattern. U.S. Pat. No. 5,538,819 to DeMarco et al discloses a formed mask having reinforced alignment marks to be used to align the stepper.

SUMMARY OF THE INVENTION

Accordingly, it is a principal object of the present invention to provide an effective means for determining misalignment between the phase-shifter and the opaque pattern in the fabrication of an alternating phase-shifting mask.

Another object of the invention is to provide a process for fabricating an alternating phase-shifting photomask having an alignment monitor.

Yet another object of the present invention is to provide a process for fabricating an alternating phase-shifting photomask having an alignment monitor wherein the alignment monitor can determine misalignment between the phase-shifter and the opaque pattern of the alternating phase-shifting mask.

Yet another object of the present invention is to provide a process for fabricating an alternating phase-shifting photomask having an alignment monitor wherein the alignment monitor can determine misalignment and the direction of misalignment between the phase-shifter and the opaque pattern of the alternating phase-shifting mask.

In accordance with the objects of this invention a new process for fabricating an alternating phase-shifting photomask having an alignment monitor is achieved. An opaque layer is provided overlying a substrate. The opaque layer is patterned to provide a mask pattern. A phase-shifting pattern is formed on the substrate wherein a portion of the phase-shifting pattern comprises an alignment monitor whereby alignment between the mask pattern and the phase-shifting pattern can be tested.

BRIEF DESCRIPTION OF THE DRAWINGS

In the accompanying drawings forming a material part of this description, there is shown.

DESCRIPTION OF THE PREFERRED EMBODIMENTS

The present invention provides a means for capturing misalignment between the phase shifter and the opaque pattern of an alternating phase-shifting mask (APSM). It can be used to determine misalignment for any shifter and chrome, for example. The alignment monitor of the present invention can also determine the direction of misalignment.

Figure 2A:
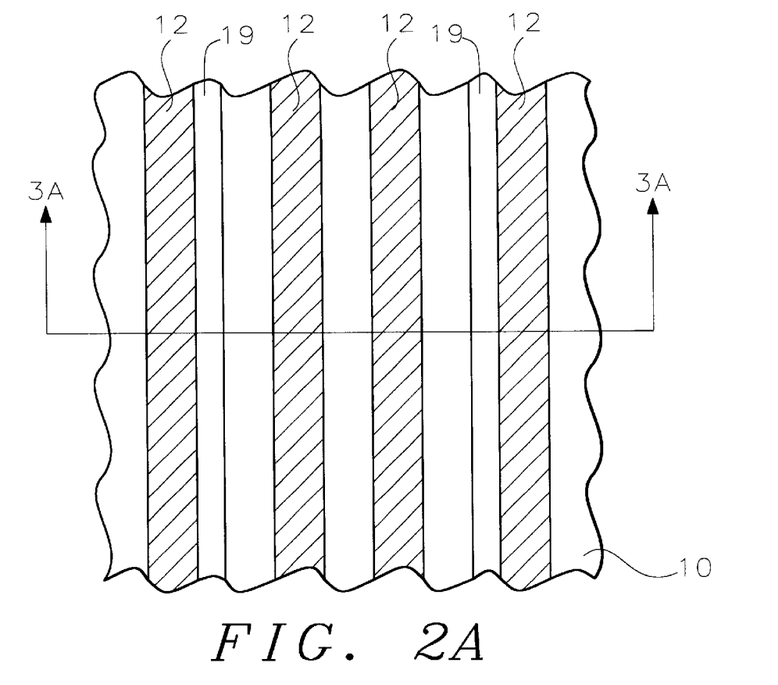
FIGS. 2A and 2B schematically illustrate in top view a preferred embodiment of an alternating phase-shifting mask with alignment monitor of the present invention.
Figure 2B:
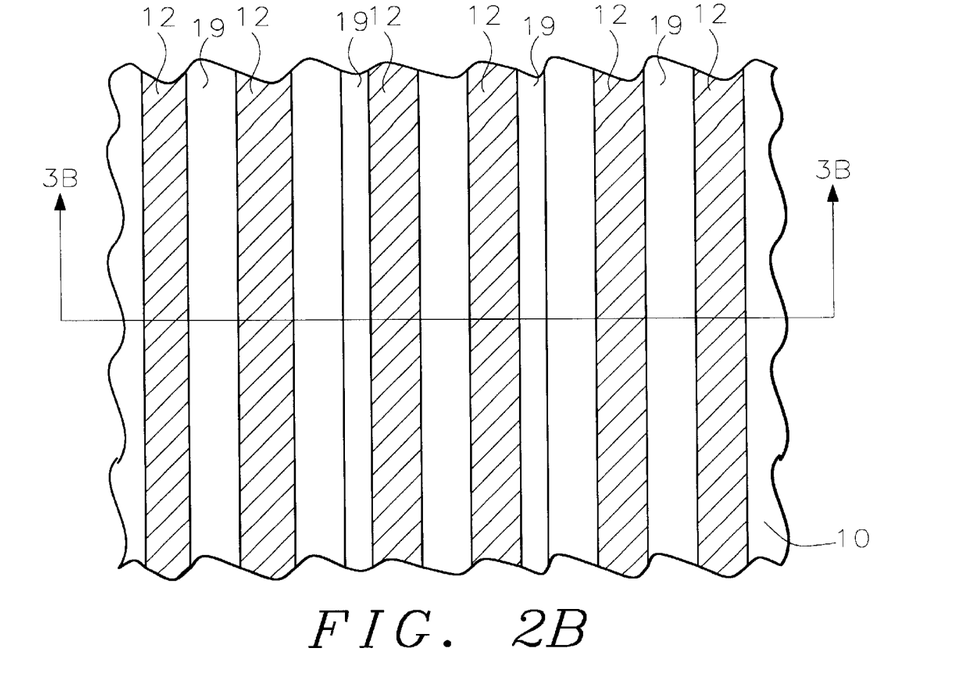

Referring now to FIG. 2A and 2B, there is shown an illustration in top view of an alternating phase-shifting photomask. The substrate 10 is a quartz plate. An opaque layer has been deposited on the substrate 10 to a preferred thickness of between about 100 and 10,000 Angstroms. The opaque layer may be chromium, multi-layer chrome based, or molybdenum silicon based opaque structure. The opaque layer is patterned to form the desired mask pattern 12 as shown in FIGS. 2A and 2B, and in cross-section in FIGS. 3A and 3B. The substrate 10 is etched into to provide the phase-shifting function.

Figure 3A:
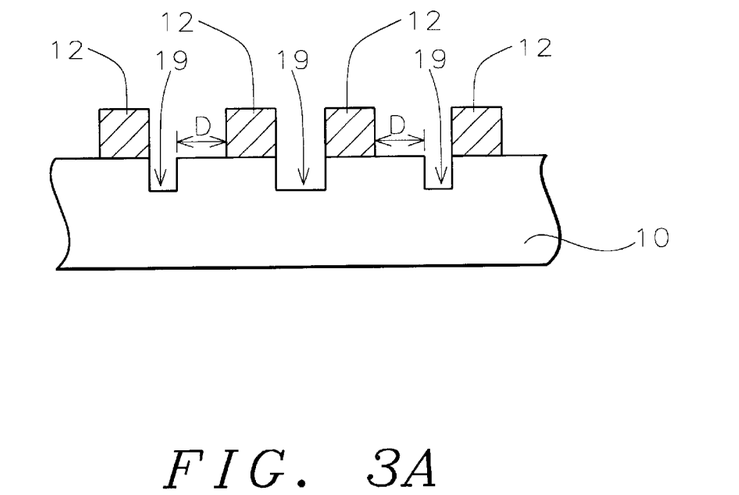
FIGS. 3A and 3B schematically illustrate in cross-sectional representation a preferred embodiment of the alternating phase-shifting mask with alignment monitor of the present invention.
Figure 3B:
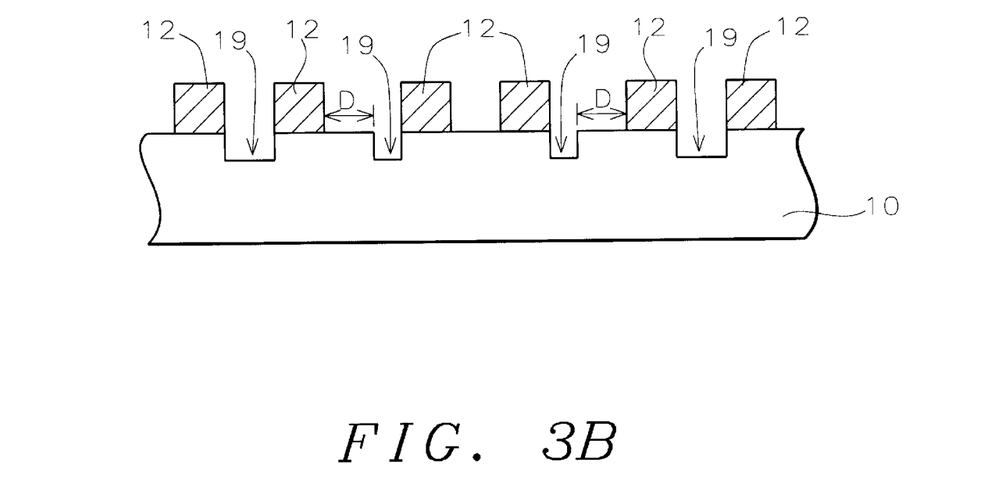

Alternately, a phase-shifting material, such as CrON, MoSiON, or CrF, is coated over the opaque layer and patterned to form the phase-shifting pattern, not shown. The alternative shown in FIGS. 3A and 3B is most preferred because this fabrication technique is most commonly used. The present invention is also suitable for the double exposure type of PSM and the multi-phase PSM that make use of different quartz thicknesses to control phase shift.

Figure 4A:
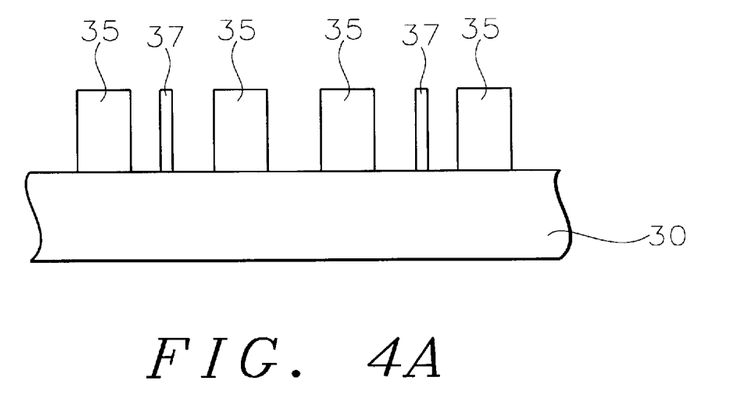
FIGS. 4A and 4B schematically illustrate in cross-sectional representation the print-down resist pattern made by the alignment monitor of the present invention showing no misalignment.
Figure 4B:
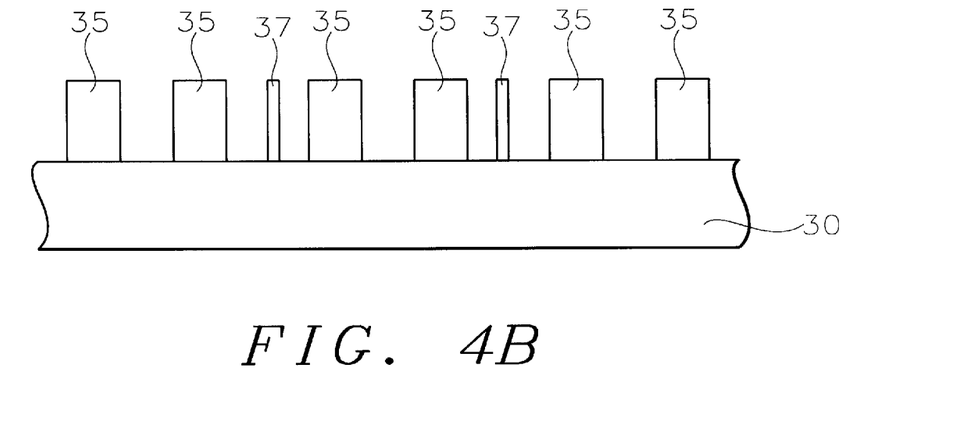

FIGS. 3A and 3B show two alternative mask design patterns. They can be either in the X or the Y direction. The print-down resist patterns shown in FIGS. 4A, 5A, and 6A could be the result of mask pattern 3A. The print-down resist patterns shown in FIGS. 4B, 5B, and 6B could be the result of mask pattern 3B.

Figure 7:
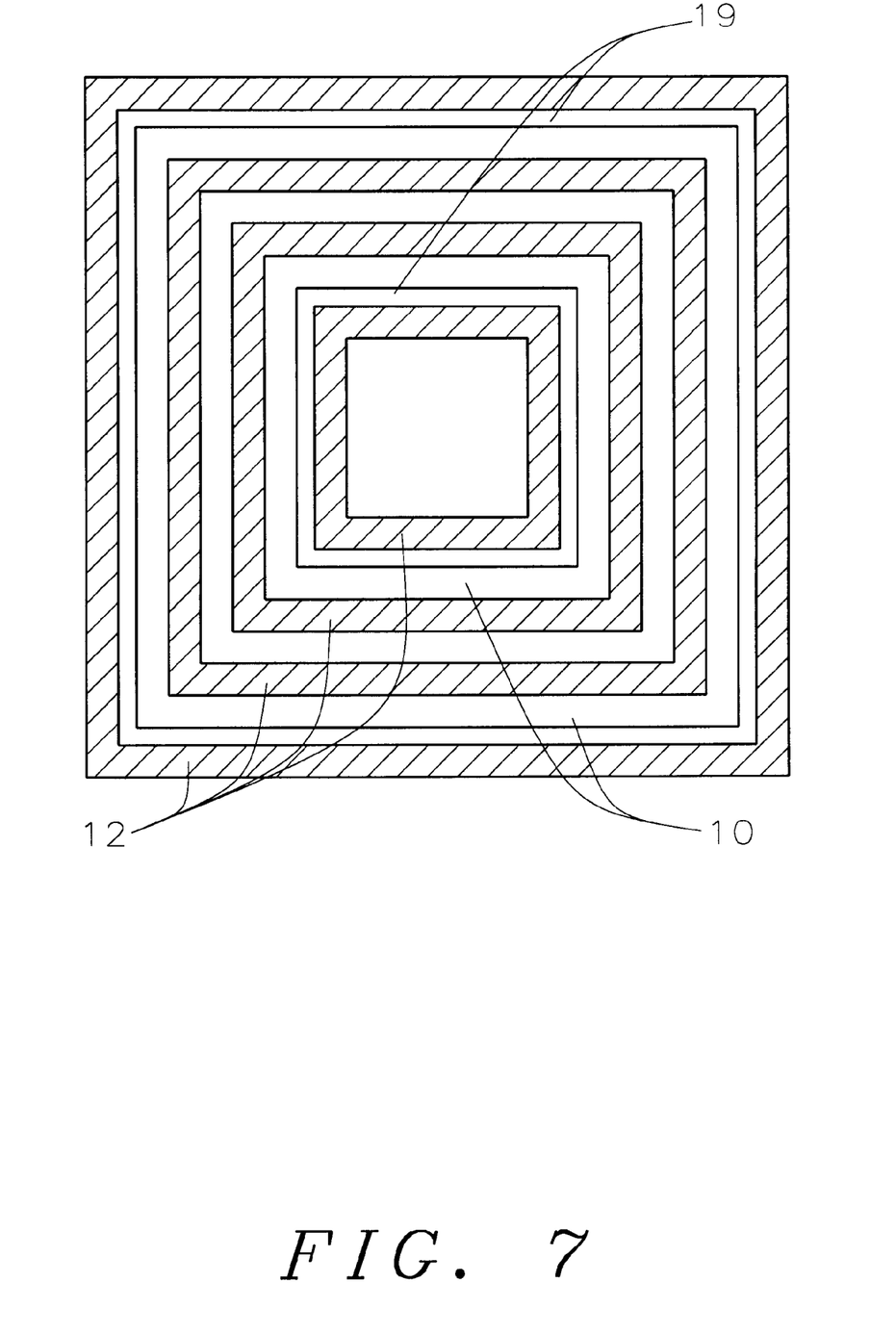
FIGS. 7 and 8 schematically illustrate in top view a preferred embodiment of a test structure that can determine misalignment in the X or Y direction.
Figure 8:
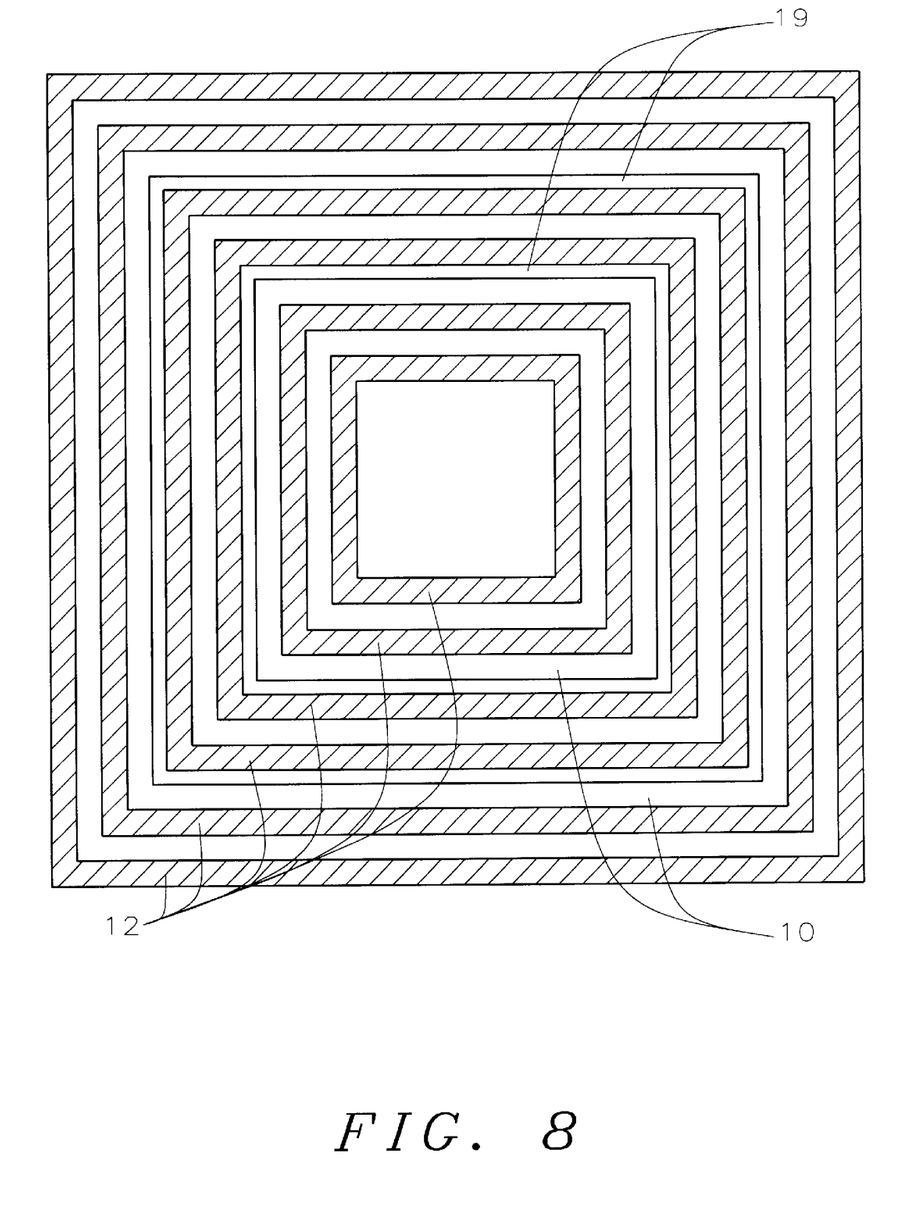

It is preferred that the alignment monitor have at least four edges and a central portion. FIG. 7 is a complete top view of the reticle in FIG. 3A, showing the alignment monitor pattern 19 around the four edges and in a central portion. FIG. 8 is a complete top view of the reticle in FIG. 3B.

After the APSM has been fabricated, it is tested to determine whether or not the opaque pattern and the phase-shifter have been misaligned. A test substrate 30 (shown in FIGS. 4A–6A and 4B–6B) is coated with a resist 35. The resist is exposed to a light source through the mask of the present invention, either the mask in FIG. 3A or the mask in FIG. 3B. The exposed resist is developed, resulting in the print down pattern shown in FIGS. 4A and 4B. The narrow portions 37 are formed by the alignment monitor. The clean pattern of these narrow portions 37 indicate that no misalignment of the phase-shifter and the opaque pattern has occurred.

Figure 5A:
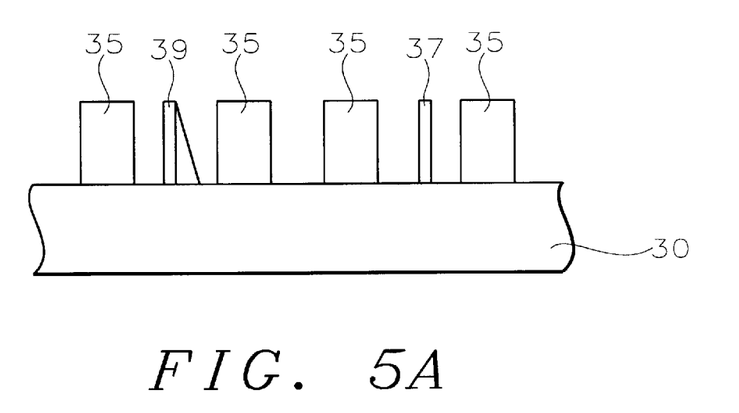
FIGS. 5A and 5B schematically illustrate in cross-sectional representation the print-down resist pattern made by the alignment monitor of the present invention showing misalignment to the right.
Figure 5B:
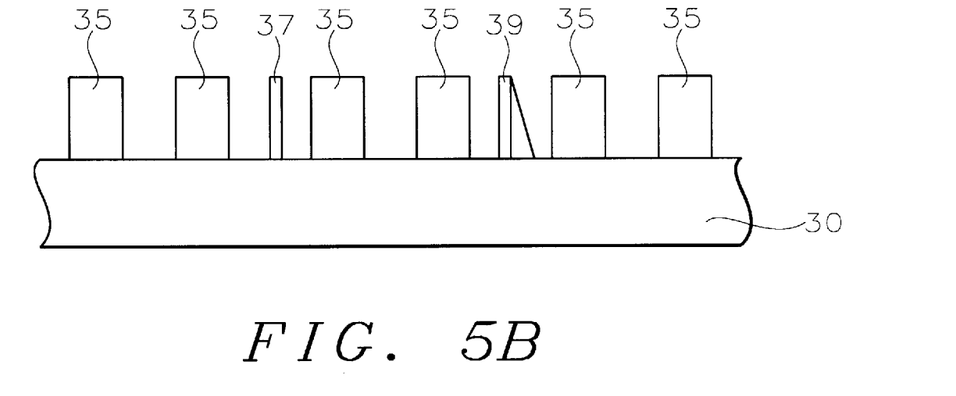

The print down resist pattern shown in FIGS. 5A and 5B shows a misalignment of the phase-shifter to the left with respect to the chrome. The pattern 39 does not have vertical sidewalls, but has a sidewall slanted to the right indicating misalignment to the left.

Figure 6A:
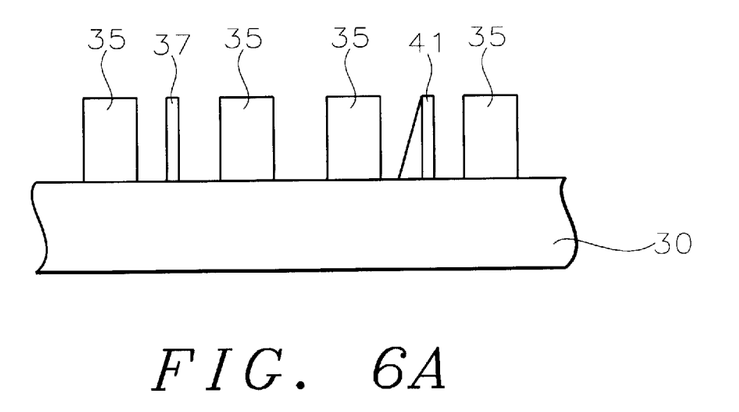
FIGS. 6A and 6B schematically illustrate in cross-sectional representation the print-down resist pattern made by the alignment monitor of the present invention showing misalignment to the left.
Figure 6B:
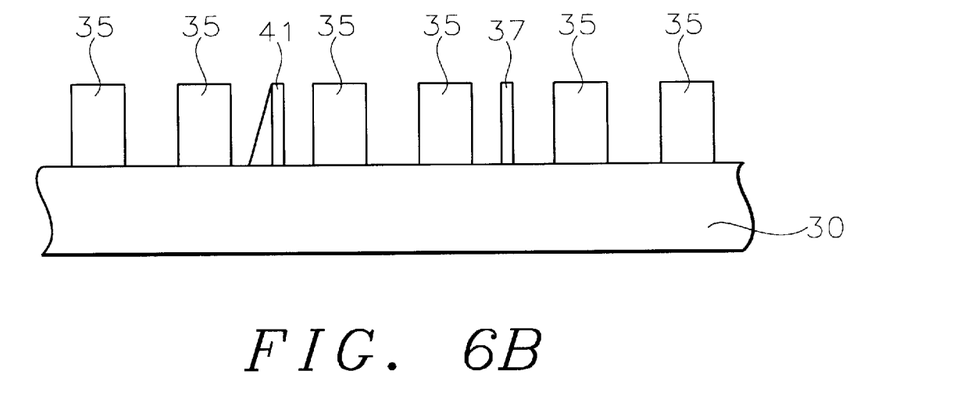

The print down resist pattern shown in FIGS. 6A and 6B shows a misalignment of the phase-shifter to the right with respect to the chrome. The pattern 41 does not have vertical sidewalls, but has a sidewall slanted to the left indicating misalignment to the right.

In each of the two misalignment examples shown, only one of the narrow patterns has a slanted sidewall. This is due to the light interference from close proximity of the phase-shifting edge to the chrome structure. That is the reason it is necessary to have the alignment monitor structure both at the four edges and in the center.

Using the alignment monitor of the present invention, it is very obvious to observe the misalignment direction. A surface scanning electron microscope (SEM) reading will be all that is necessary to see the misalignment direction.

The print down patterns shown in FIGS. 5 and 6 are caused by light interference which results in the changes in the resist profile 39 and 41. The light interference is due to the close proximity of the opaque structure and the phase-shifter edge. Certain portions of the phase-shifted light is not high enough in magnitude nor in the degree of phase shift, therefore causing the slanted profile of the resulting resist pattern. The distance D (shown in FIGS. 3A and 3B) between the phase-shifter edge and the opaque edge should be about ½ the wavelength of the light source.

The process of the present invention provides a means for determining misalignment of the phase-shifter and the opaque pattern in any alternating phase-shifting mask. An alignment monitor is fabricated of phase-shifting material on the APSM wherein the distance from the edge of the alignment monitor to the adjacent opaque pattern is around ½ the wavelength of the light source to be used. If the alignment monitor shows a non-vertical print down resist pattern, misalignment has occurred.

While the invention has been particularly shown and described with reference to the preferred embodiments thereof, it will be understood by those skilled in the art that various changes in form and details may be made without departing from the spirit and scope of the invention.

What is claimed is:

1. The method of fabricating an alternating phase-shifting mask having an alignment monitor comprising:

providing an opaque layer overlying a substrate;

patterning said opaque layer to provide a mask pattern; and thereafter forming a phase-shifting pattern on said substrate wherein a portion of said phase-shifting pattern comprises an alignment monitor whereby alignment between said mask pattern and said phase-shifting pattern can be observed visually and wherein the direction of misalignment can be determined.

2. The method according to claim 1 wherein said substrate comprises quartz.

3. The method according to claim 1 wherein said opaque layer comprises one of the group containing chromium and molybdenum/silicon.

4. The method according to claim 1 wherein said step of forming said phase-shifting pattern comprises:

etching grooves into said substrate wherein said grooves form said phase-shifting pattern.

5. The method according to claim 1 wherein said step of forming said phase-shifting pattern comprises depositing a phase-shifting material overlying patterned said opaque layer and said substrate; and patterning said phase-shifting material to form said phase-shifting pattern.

6. The method according to claim 1 wherein a distance between an edge of said alignment monitor and an adjacent portion of said opaque pattern is about ½ the wavelength of a light source to be used with said alternating phase-shifting mask.

7. The method according to claim 1 wherein said alignment between said mask pattern and said phase-shifting pattern is tested by the following steps coating a test substrate with a resist layer;

exposing said resist layer to a light source through said alternating phase-shifting mask having said alignment monitor;

developing away exposed said resist layer and visually observing remaining pattern said resist layer corresponding to said alignment monitor wherein vertical sidewalls on said patterned resist layer indicate no misalignment and wherein non-vertical sidewalls on said patterned resist layer indicate misalignment between said mask pattern and said phase-shifting pattern.

8. The method according to claim 7 wherein the direction of slant of said non-vertical sidewalls on said patterned resist layer indicate the direction of misalignment between said mask pattern and said phase-shifting pattern.

9. The method of fabricating an alternating phase-shifting mask having an alignment monitor comprising:

providing an opaque layer overlying a substrate;

patterning said opaque layer to provide a mask pattern; and thereafter forming a phase-shifting pattern on said substrate wherein a portion of said phase-shifting pattern comprises an alignment monitor whereby alignment between said mask pattern and said phase-shifting pattern can be observed visually and wherein the direction of misalignment can be determined wherein a distance between an edge of said alignment monitor and an adjacent portion of said opaque pattern is about 1/2 the wavelength of a light source to be used with said alternating phase-shifting mask.

10. The method according to claim 9 wherein said substrate comprises quartz.

11. The method according to claim 9 wherein said opaque layer comprises one of the group containing chromium and molybdenum/silicon.

12. The method according to claim 9 wherein said step of forming said phase-shifting pattern comprises:

etching grooves into said substrate wherein said grooves form said phase-shifting pattern.

13. The method according to claim 9 wherein said step of forming said phase-shifting pattern comprises depositing a phase-shifting material overlying patterned said opaque layer and said substrate; and patterning said phase-shifting material to form said phase-shifting pattern.

14. The method according to claim 9 wherein said alignment between said mask pattern and said phase-shifting pattern is tested by the following steps coating a test substrate with a resist layer;

exposing said resist layer to a light source through said alternating phase-shifting mask having said alignment monitor;

developing away exposed said resist layer; and visually observing remaining patterned said resist layer corresponding to said alignment monitor wherein vertical sidewalls on said patterned resist layer indicate no misalignment and wherein non-vertical sidewalls on said patterned resist layer indicate misalignment between said mask pattern and said phase-shifting pattern.

15. The method according to claim 14 wherein the direction of slant of said non-vertical sidewalls on said patterned resist layer indicate the direction of misalignment between said mask pattern and said phase-shifting pattern.

16. An alternating phase-shifting mask having an alignment monitor comprising:

a patterned opaque layer overlying a substrate forming a mask pattern; and a phase-shifting pattern on said substrate wherein a portion of said phase-shifting pattern comprises an alignment monitor whereby alignment between said mask pattern and said phase-shifting pattern can be observed visually and wherein the direction of misalignment can be determined wherein a distance between an edge of said alignment monitor and an adjacent portion of said pattern opaque layer is about 1/2 the wavelength of a light source to be used with said alternating phase-shifting mask.

17. The mask according to claim 16 wherein said alignment monitor has a pattern around four edges and in a centtral portion of said mask.

18. The mask according to claim 16 wherein said substrate comprises quartz and wherein said opaque layer comprises one of the group containing chromium and molybdenum/silicon.

19. The mask according to claim 16 wherein said phase-shifting pattern comprises grooves etched into said substrate.

20. The mask according to claim 16 wherein alignment between said mask pattern and said phase-shifting pattern is tested by the following steps coating a test substrate with a resist layer;

exposing said resist layer to a light source through said alternating phase-shifting mask having said alignment monitor;

developing away exposed said resist layer and visually observing remaining patterned said resist layer corresponding to said alignment monitor wherein vertical sidewalls on said patterned resist layer indicate no misalignment and wherein non-vertical sidewalls on said patterned resist layer indicate misalignment between said mask pattern and said phase-shifting pattern and wherein the direction of slant of said non-vertical sidewalls on said patterned resist layer indicate the direction of misalignment between said mask pattern and said phase-shifting pattern.

21. A method of testing alignment between a mask pattern and a phase-shifting pattern on a reticle comprising:

fabricating an alternating phase-shifting mask having an alignment monitor comprising:

providing an opaque layer overlying a substrate;

patterning said opaque layer to provide a mask pattern; and thereafter forming a phase-shifting pattern on said substrate wherein a portion of said phase-shifting pattern comprises an alignment monitor;

coating a test substrate with a resist layer;

exposing said resist layer to a light source through said alternating phase-shifting mask having said alignment monitor;

developing away exposed said resist layer; and visually observing remaining patterned said resist layer corresponding to said alignment monitor wherein vertical sidewalls on said patterned resist layer indicate no misalignment and wherein non-vertical sidewalls on said patterned resist layer indicate misalignment between said mask pattern and said phase-shifting pattern.

22. The method according to claim 21 wherein said step of visually observing remaining patterned said resist layer comprises a scanning electron microscope reading.

23. The method according to claim 21 wherein said substrate comprises quartz and wherein said opaque layer comprises one of the group containing chromium and molybdenum/silicon.

24. The method according to claim 21 wherein said phase-shifting pattern comprises grooves etched into said substrate.

25. The method according to claim 21 wherein said the direction of slant of said non-vertical sidewalls on said patterned resist layer indicate the direction of misalignment between said mask pattern and said phase-shifting pattern.

* * * * *